US010833168B2

(12) United States Patent
Seo et al.

(10) Patent No.: US 10,833,168 B2
(45) Date of Patent: Nov. 10, 2020

(54) COMPLEMENTARY METAL-OXIDE-SEMICONDUCTOR (CMOS) NANOSHEET DEVICES WITH EPITAXIAL SOURCE/DRAINS AND REPLACEMENT METAL GATE STRUCTURES

(71) Applicant: INTERNATIONAL BUSINESS MACHINES CORPORATION, Armonk, NY (US)

(72) Inventors: Soon-Cheon Seo, Glenmont, NY (US); Injo Ok, Loudonville, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/297,145

(22) Filed: Mar. 8, 2019

(65) Prior Publication Data

US 2020/0287020 A1 Sep. 10, 2020

(51) Int. Cl.

| | |
|---|---|
| ***H01L 29/66*** | (2006.01) |
| ***H01L 29/08*** | (2006.01) |
| ***H01L 21/8238*** | (2006.01) |
| ***H01L 27/092*** | (2006.01) |
| ***H01L 29/423*** | (2006.01) |

(Continued)

(52) U.S. Cl.

CPC .................. *H01L 29/66545* (2013.01); *H01L 21/823814* (2013.01); *H01L 21/823828* (2013.01); *H01L 21/845* (2013.01); *H01L 27/0924* (2013.01); *H01L 27/1211* (2013.01); *H01L 29/0673* (2013.01); *H01L 29/0847* (2013.01); *H01L 29/42392* (2013.01); *H01L 29/6656* (2013.01); *H01L 29/66553* (2013.01); *H01L 21/02532* (2013.01); *H01L 21/26513* (2013.01); *H01L 21/31116* (2013.01); *H01L 27/1104* (2013.01)

(58) Field of Classification Search

CPC combination set(s) only.
See application file for complete search history.

(56) References Cited

U.S. PATENT DOCUMENTS

| | | | | |
|---|---|---|---|---|
| 9,490,335 | B1 | 11/2016 | Doris et al. | |
| 9,653,289 | B1 * | 5/2017 | Balakrishnan | ........ H01L 27/088 |

(Continued)

*Primary Examiner* — Telly D Green
(74) *Attorney, Agent, or Firm* — Tutunjian & Bitetto, P.C.; Douglas Pearson

(57) ABSTRACT

A method of forming complementary metal-oxide-semiconductor (CMOS) nanosheet devices is provided. The method includes forming at least two adjacent trimmed stacks of sacrificial sheet segments and semiconductor nanosheet segments on a substrate, with a dummy gate structure and sidewall spacers on each of the at least two adjacent trimmed stacks. The method further includes forming a protective cap layer over the trimmed stacks, and forming a sacrificial fill layer on the protective cap layer. The method further includes forming a recess through the sacrificial fill layer and protective cap layer between the stacks, depositing a recess liner in the recess, and forming a dielectric fill layer in the recess on the recess liner. The method further includes forming a capping layer on one of the trimmed stacks, removing the sacrificial fill layer from another one of the trimmed stacks, and forming a source/drain on the semiconductor nanosheet segments.

15 Claims, 12 Drawing Sheets

220
215
215
200
220
220
190
190
110

260
250
200
240
230
240
200
230
230
110
190
190

(51) Int. Cl.

| | |
|---|---|
| ***H01L 27/12*** | (2006.01) |
| ***H01L 29/06*** | (2006.01) |
| ***H01L 21/84*** | (2006.01) |
| ***H01L 21/311*** | (2006.01) |
| ***H01L 21/02*** | (2006.01) |
| ***H01L 21/265*** | (2006.01) |
| ***H01L 27/11*** | (2006.01) |

(56) References Cited

U.S. PATENT DOCUMENTS

| | | | | |
|---|---|---|---|---|
| 9,711,414 | B2 | 7/2017 | Hatcher et al. | |
| 9,741,622 | B2 | 8/2017 | Jacob | |
| 9,773,886 | B1 | 9/2017 | Palle et al. | |
| 9,947,767 | B1* | 4/2018 | Chao | H01L 29/42392 |
| 9,972,542 | B1 | 5/2018 | Bi et al. | |
| 9,997,519 | B1 | 6/2018 | Bao et al. | |
| 10,008,583 | B1 | 6/2018 | Rodder et al. | |
| 10,074,575 | B1 | 9/2018 | Guillorn et al. | |
| 10,074,727 | B2 | 9/2018 | Adusumilli et al. | |
| 10,361,202 | B2* | 7/2019 | Suh | H01L 27/0924 |
| 2016/0020305 | A1* | 1/2016 | Obradovic | H01L 29/7391 257/39 |
| 2016/0027870 | A1* | 1/2016 | Cheng | H01L 29/66545 257/347 |
| 2016/0365440 | A1* | 12/2016 | Suk | H01L 29/42392 |
| 2017/0110554 | A1* | 4/2017 | Tak | H01L 29/42392 |
| 2017/0365604 | A1 | 12/2017 | Suh et al. | |
| 2018/0219082 | A1* | 8/2018 | Guillorn | H01L 29/66742 |
| 2018/0226490 | A1* | 8/2018 | Le | H01L 29/0673 |
| 2018/0294331 | A1* | 10/2018 | Cho | H01L 29/0669 |
| 2020/0035705 | A1* | 1/2020 | Kim | H01L 27/088 |
| 2020/0052107 | A1* | 2/2020 | Lie | H01L 29/775 |
| 2020/0126987 | A1* | 4/2020 | Rubin | H01L 29/0673 |

* cited by examiner

COMPLEMENTARY METAL-OXIDE-SEMICONDUCTOR (CMOS) NANOSHEET DEVICES WITH EPITAXIAL SOURCE/DRAINS AND REPLACEMENT METAL GATE STRUCTURES

BACKGROUND

The present invention generally relates to nanosheet transistor devices, and more particularly to complementary metal-oxide-semiconductor (CMOS) nanosheet devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, planar FETs have been fabricated with the source, channel, and drain formed in the substrate material itself, where the current flows horizontally along the channel (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming complementary metal-oxide-semiconductor (CMOS) nanosheet devices is provided. The method includes forming at least two adjacent trimmed stacks of sacrificial sheet segments and semiconductor nanosheet segments on a substrate, with a dummy gate structure and sidewall spacers on each of the at least two adjacent trimmed stacks, and replacing a portion of each of the sacrificial sheet segments with an inner spacer. The method further includes forming a protective cap layer over the at least two adjacent trimmed stacks with the dummy gate structure and the sidewall spacers, and forming a sacrificial fill layer on the protective cap layer. The method further includes forming a recess through the sacrificial fill layer and protective cap layer between the at least two adjacent trimmed stacks with the dummy gate structure and the sidewall spacers, depositing a recess liner in the recess, and forming a dielectric fill layer in the recess on the recess liner. The method further includes forming a capping layer on one of the at least two adjacent trimmed stacks, removing the sacrificial fill layer from at least another one of the at least two adjacent trimmed stacks, and forming a source/drain on the semiconductor nanosheet segments of the other one of the at least two adjacent trimmed stacks.

In accordance with another embodiment of the present invention, a method of forming complementary metal-oxide-semiconductor (CMOS) nanosheet devices is provided. The method includes forming at least two adjacent trimmed stacks of sacrificial sheet segments and semiconductor nanosheet segments on a substrate, with a dummy gate structure and sidewall spacers on each of the at least two adjacent trimmed stacks, and replacing a portion of each of the sacrificial sheet segments with an inner spacer. The method further includes forming a protective cap layer over the at least two adjacent trimmed stacks with the dummy gate structure and the sidewall spacers, and forming a sacrificial fill layer on the protective cap layer. The method further includes forming a masking layer on the sacrificial fill layer, and patterning the masking layer to form masking blocks over the at least two adjacent trimmed stacks. The method further includes forming a recess through the sacrificial fill layer and protective cap layer between the at least two adjacent trimmed stacks with the dummy gate structure and the sidewall spacers, and removing the masking blocks. The method further includes depositing a recess liner in the recess, and forming a dielectric fill layer in the recess on the recess liner. The method further includes forming a capping layer on one of the at least two adjacent trimmed stacks, removing the sacrificial fill layer from at least another one of the at least two adjacent trimmed stacks, and forming a source/drain on the semiconductor nanosheet segments of the other one of the at least two adjacent trimmed stacks.

In accordance with yet another embodiment of the present invention, a complementary metal-oxide-semiconductor (CMOS) nanosheet device is provided. The device includes a first pair of source/drains on a substrate with one or more semiconductor nanosheet segment(s) between the first pair of source/drains, and a second pair of source/drains on the substrate adjacent to the first pair with one or more semiconductor nanosheet segment(s) between the second pair of source/drains. The device further includes a recess liner and a dielectric fill layer between the first pair of source/drains and the second pair of source/drains. The device further includes a first gate-all-around structure on the one or more semiconductor nanosheet segment(s) between the first pair of source/drains, and a second gate-all-around structure on the one or more semiconductor nanosheet segment(s) between the second pair of source/drains.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide complementary metal-oxide-semiconductor (CMOS) nanosheet devices with dual source/drain epitaxial formation. A source drain region can be defined with a dummy silicon (Si) block, and an n-type field effect transistor (NFET) epitaxial source/drain growth conducted before formation of a replacement metal gate (RMG), which may be conducted at a temperature greater than 700° C. (i.e., a high temp process), and a p-type field effect transistor (PFET) epitaxial source/drain growth can be conducted after the RMG process (referred to as a late SiGe PFET EPI) at a lower temperature (e.g., about 550° C.).

Embodiments of the present invention provide a method of forming a complementary metal-oxide-semiconductor (CMOS) nanosheet device with dual source/drain epitaxial formation, where a late silicon-germanium (SiGe) epitaxial growth process can be achieved at a lower temperature (e.g., about 550° C.) without impacting the threshold voltage, $V_T$, of a previously formed replacement metal gate (RMG) structure. A sacrificial PFET epitaxial region (e.g., dummy silicon (Si) block) can be provided, and a PFET SiGe epitaxial growth process performed after the RMG process. An NFET source/drain dopant implantation can be performed without additional lithography steps.

In various embodiments, the PFET and NFET can be defined by self-aligned trench contacts, such that contact trench patterning is nor utilized. Gate collapse due to undercutting during isolation region formation can be prevented or avoided.

Exemplary applications/uses to which the present invention can be applied include, but are not limited to: nanosheet transistors for 5 nm and beyond high-end technology nodes.

It is to be understood that aspects of the present invention will be described in terms of a given illustrative architecture; however, other architectures, structures, substrate materials and process features and steps can be varied within the scope of aspects of the present invention.

Figure 1:
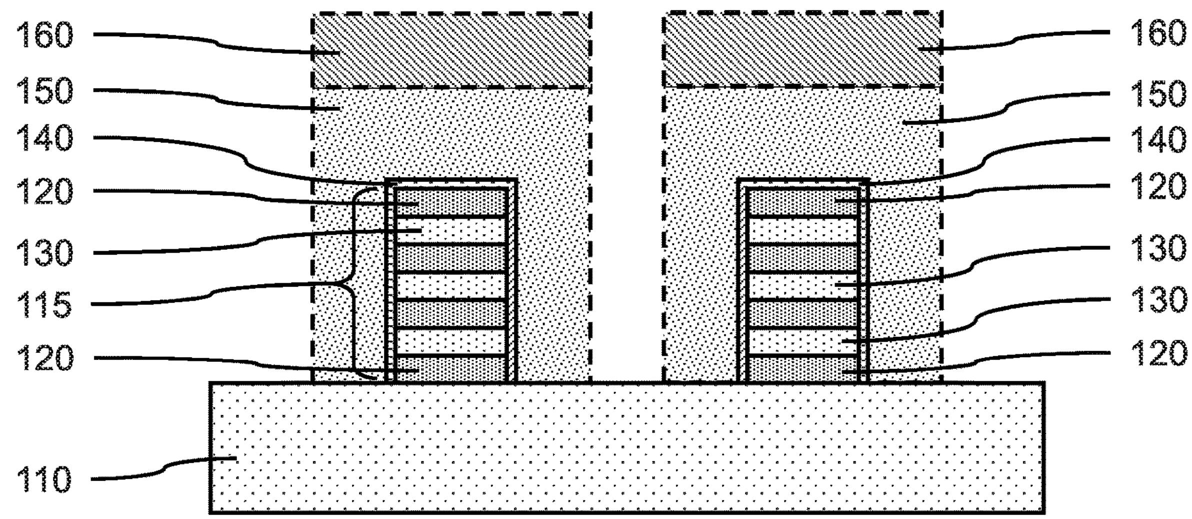
FIG. 1 is a cross-sectional side view showing a dummy gate structure formed on each of a pair of adjacent stacks of alternating sacrificial sheets and semiconductor nanosheets with a protective liner on the alternating stack, in accordance with an embodiment of the present invention.

Referring now to the drawings in which like numerals represent the same or similar elements and initially to FIG. 1, a cross-sectional side view of a dummy gate structure formed on each of a pair of adjacent stacks of alternating sacrificial sheets and semiconductor nanosheets with a protective liner on the alternating stack is shown, in accordance with an embodiment of the present invention.

In one or more embodiments, a pair of stacks 115 of alternating sacrificial sheets 120 and semiconductor nanosheets 130 can be formed on a substrate 110. The stacks 115 can be adjacent to each other on the same region of the substrate, where the stacks can be separated by a predetermined gap. In the figures, the left hand side can represent a PFET gate and the right hand side can represent an NFET gate close to each other, for example in a ring oscillator or SRAM regions.

In various embodiments, the distance between adjacent stacks 115 on the same region of the substrate 110 can be in a range of about 20 nanometers (nm) to about 80 nm, or about 30 nm to about 50 nm, although other distances are also contemplated. The small gaps between the adjacent stacks 115, for example, for PFET and NFET gates stacks in an SRAM, can make epitaxial growth of source/drains difficult due to the source/drains encroaching on each other and shorting.

In one or more embodiments, an alternating sequence of sacrificial sheets 120 and semiconductor nanosheets 130 can be formed on a substrate 110, where the sacrificial sheets 120 and semiconductor nanosheets 130 can be formed by epitaxial or heteroepitaxial growth on the surface of an underlying layer. In various embodiments, a first sacrificial sheet 120 can be formed on the exposed surface of the substrate 110 by epitaxial or heteroepitaxial growth. A first semiconductor nanosheet 130 can be formed on the exposed surface of the first sacrificial sheet 120 by epitaxial or heteroepitaxial growth. A second sacrificial sheet 120 can be formed on the exposed surface of the first semiconductor nano sheet 130 by epitaxial or heteroepitaxial growth. The sequence can be repeated to form stacks 115 of multiple alternating layers, where a sacrificial sheet 120 can be the bottom most sheet and the top most sheet. In various embodiments, the alternating sequence of sacrificial sheets 120 and semiconductor nanosheets 130 can be formed by patterning stacks of alternating sacrificial layers and semiconductor nanosheet layers into one or more stacks 115 using lithographic processes and etching.

In one or more embodiments, a protective liner 140 can be formed on each of the alternating stacks 115 of sacrificial sheets 120 and semiconductor nanosheets 130. The protective liner 140 can be formed by a conformal deposition, for example, atomic layer deposition (ALD), plasma enhanced ALD (PEALD), chemical vapor deposition (CVD), plasma enhanced CVD (PECVD), or combinations thereof. The protective liner 140 can be deposited on the exposed surfaces of the substrate 110, sacrificial sheets 120, and semiconductor nanosheets 130, and portions etched back from the substrate 110.

In various embodiments, the protective liner 140 can be a material that can be selectively etched relative to the sacrificial sheets 120 and semiconductor nanosheets 130, as well as the material of a dummy gate layer 150 and dummy gate cap 160 forming a dummy gate structure 165. In various embodiments, the protective liner 140 can be a dielectric material, including, but not limited to, silicon oxide (SiO), silicon nitride (SiN), silicon oxynitride (SiON), silicon carbo nitride (SiCN) silicon oxycarbide (SiOC), silicon boronitride (SiBN), silicon boro carbonitride (SiBCN), and combinations thereof.

In one or more embodiments, a dummy gate structure 165 can be formed on each of two or more stacks 115, where the dummy gate layer 150 can be formed around the stack on the protective liner 140. The dummy gate layer 150 can be formed by blanket depositing a layer of dummy gate layer material over the stacks 115, planarizing, and patterning the layer of dummy gate material. A dummy gate cap 160 can be formed on the dummy gate layer 150.

In various embodiments, the dummy gate layer 150 can be an easily etchable material, including, but not limited to, amorphous silicon (a-Si), amorphous carbons (a-C), silicon-germanium (SiGe), and other sacrificial materials depending on the integration scheme.

In various embodiments, the dummy gate cap 160 can be a dielectric material, including, but not limited to, silicon oxide (SiO), silicon nitride (SiN), silicon oxynitride (SiON), silicon carbo nitride (SiCN) silicon oxycarbide (SiOC), silicon boronitride (SiBN), silicon boro carbonitride (SiBCN), and combinations thereof. The dummy gate cap 160 can be a different dielectric material from the protective liner 140, so the protective liner 140 can be selectively removed.

Figure 2:
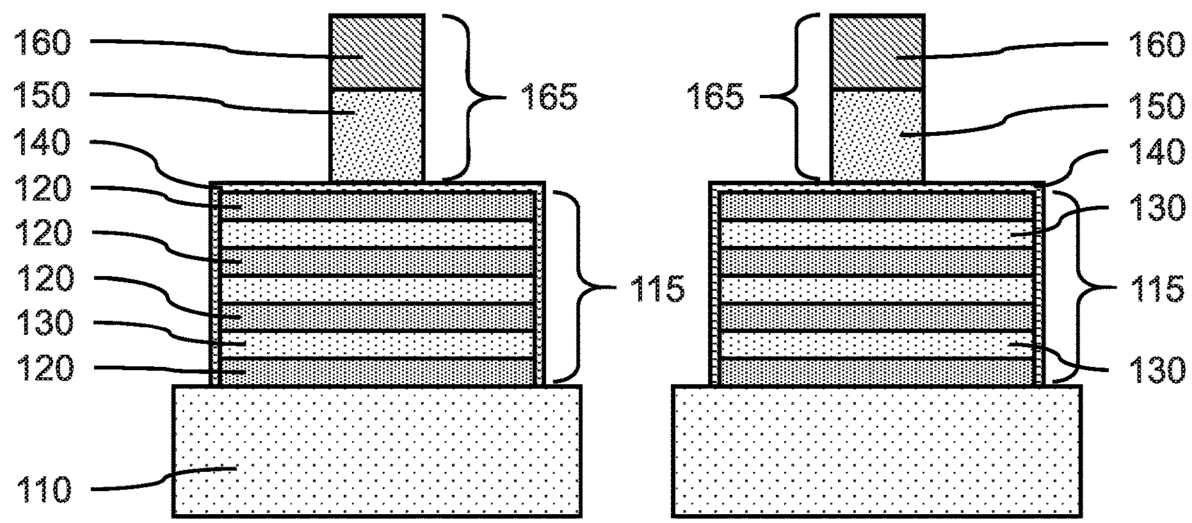
FIG. 2 is a cross-sectional side view perpendicular to FIG. 1 showing the dummy gate structures on stacks of alternating sacrificial sheets and semiconductor nanosheets with the protective liner covering the stack, in accordance with an embodiment of the present invention.

FIG. 2 is a cross-sectional side view perpendicular to FIG. 1 showing the dummy gate structures on stacks of alternating sacrificial sheets and semiconductor nanosheets with the protective liner covering the stack, in accordance with an embodiment of the present invention.

In one or more embodiments, the sacrificial sheets 120 and semiconductor nanosheets 130 can extend outward from opposites sides of the dummy gate structures, and the protective liner 140 can cover the sacrificial sheets 120 and semiconductor nanosheets 130 of each of the stacks 115.

In various embodiments, stacks for forming n-type nanosheet field effect transistor devices can be formed on different regions of the same substrate 110 from stacks for forming p-type nanosheet field effect transistor devices, where an isolation region can separate regions and devices.

Figure 3:
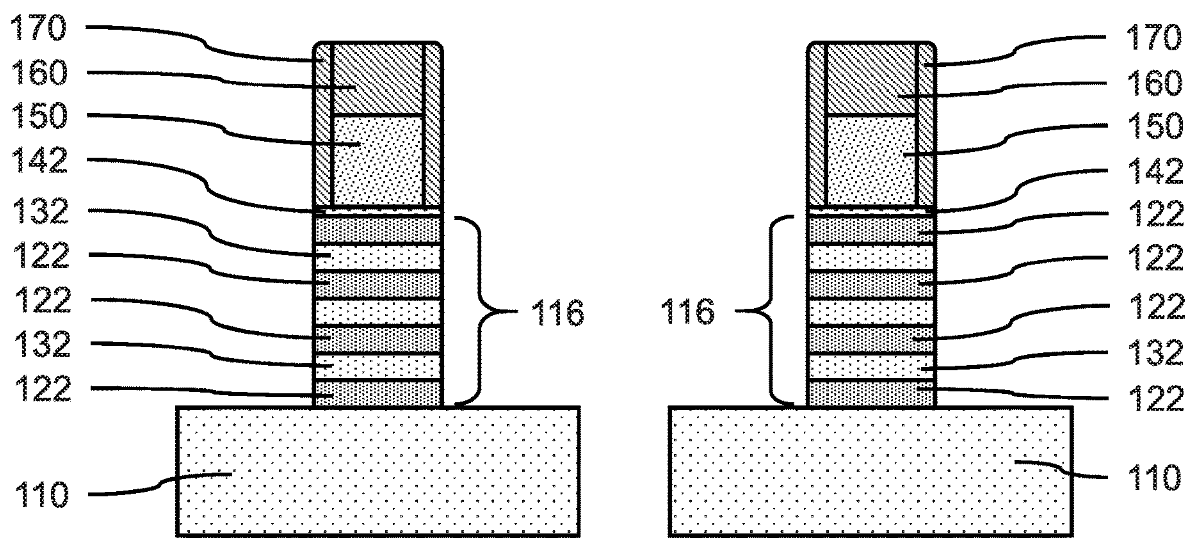
FIG. 3 is a cross-sectional side view showing sidewall spacers formed on the dummy gate structures over trimmed stacks of alternating sacrificial sheets and semiconductor nanosheets with a protective liner on the stack, in accordance with an embodiment of the present invention.

FIG. 3 is a cross-sectional side view showing sidewall spacers formed on the dummy gate structures over trimmed stacks of alternating sacrificial sheets and semiconductor nanosheets with a protective liner on the stack, in accordance with an embodiment of the present invention.

In one or more embodiments, a sidewall spacer layer (not shown) can be formed over the dummy gate structures 165 and portions of the stacks 115 extending outward from the dummy gate structures. The sidewall spacer layer can be formed by a conformal deposition (e.g., ALD, PEALD, CVD, PECVD). In various embodiments, a selective, directional etch, for example, a reactive ion etch (RIE), can be used to remove portions of the sidewall spacer layer from surfaces approximately perpendicular to the ion beam to form sidewall spacers 170 on the dummy gate structures 165.

In various embodiments, the sidewall spacer layer and sidewall spacers 170 can be a dielectric material, including, but not limited to, silicon oxide (SiO), silicon nitride (SiN), silicon oxynitride (SiON), silicon carbo nitride (SiCN) silicon oxycarbide (SiOC), silicon boronitride (SiBN), silicon boro carbonitride (SiBCN), and combinations thereof. The sidewall spacers 170 can be the same dielectric material as the dummy gate cap 160, and different from the protective liner 140, so the protective liner 140 can be selectively removed.

In one or more embodiments, the portions of the protective liner 140 extending outward from the sidewall spacers 170 and dummy gate caps 160 of the dummy gate structures 165 can be removed using a selective isotropic etch, for example, a wet chemical etch or dry plasma etch, to expose the underlying sacrificial sheets 120 and semiconductor nanosheets 130 of each of the stacks.

In one or more embodiments, the portions of the sacrificial sheets 120 and semiconductor nanosheets 130 extending outward from the sidewall spacers 170 and exposed by removal of the exposed portion of the protective liner 140 can be removed using one or more direction etches (e.g., RIE) to form trimmed stacks 116 of sacrificial sheet segments 122 and semiconductor nanosheet segments 132. The trimmed stacks 116 of sacrificial sheet segments 122 and semiconductor nanosheet segments 132 can be below the trimmed protective liner segments 142, sidewall spacers 170, and dummy gate structures 165.

Figure 4:
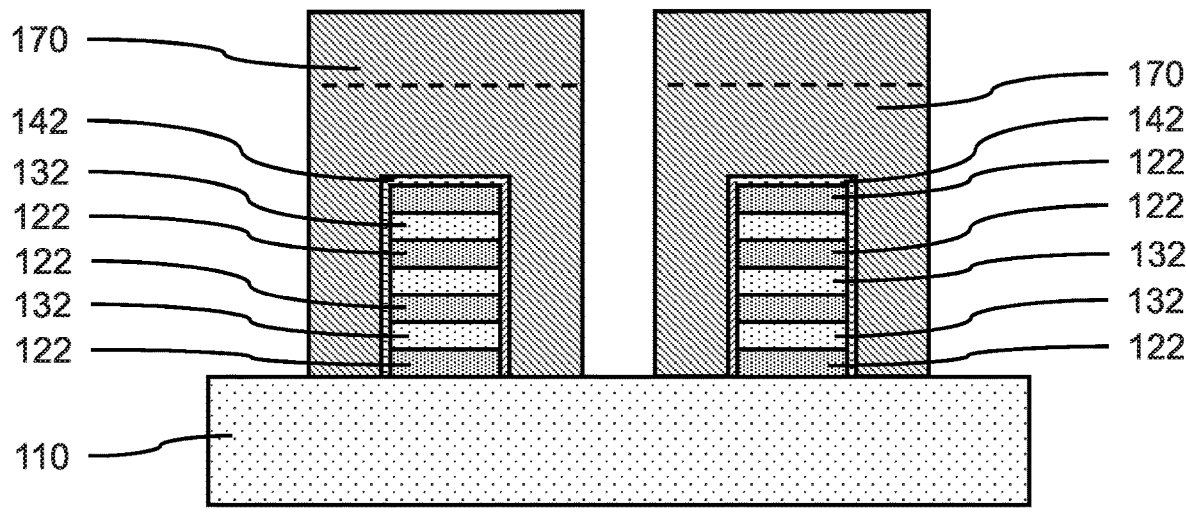
FIG. 4 is a cross-sectional side view perpendicular to FIG. 3 showing the side face of the sidewall spacers on the dummy gate structures of adjacent stacks of alternating sacrificial sheet segments and semiconductor nanosheet segments with the protective liner under the sidewall spacers, in accordance with an embodiment of the present invention.

FIG. 4 is a cross-sectional side view perpendicular to FIG. 3 showing the side face of the sidewall spacers on the dummy gate structures of adjacent stacks of alternating sacrificial sheet segments and semiconductor nanosheet segments with the protective liner under the sidewall spacers, in accordance with an embodiment of the present invention.

In one or more embodiments, the side faces of the sidewall spacers 170 on the dummy gate structures 165 can be coplanar with the protective liner segment 142, sacrificial sheet segments 122, and semiconductor nanosheet segments 132, where the dummy gate structure 165 is around three sides of the trimmed stack 116. Dummy gate structures 165 can be across adjacent trimmed stacks.

Figure 5:
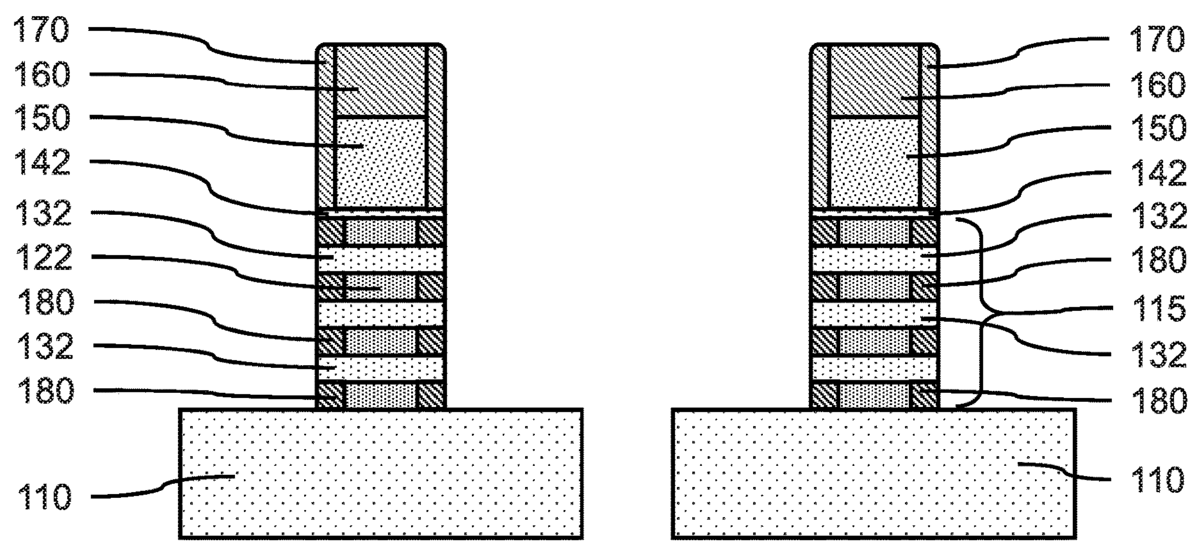
FIG. 5 is a cross-sectional side view showing portions of the sacrificial sheet segments replaced with inner spacers, in accordance with an embodiment of the present invention.

FIG. 5 is a cross-sectional side view showing portions of the sacrificial sheet segments replaced with inner spacers, in accordance with an embodiment of the present invention.

In one or more embodiments, portions of the sacrificial sheet segments 122 exposed on opposite sides of the dummy gate structures 165 can be removed to form cavities above and below semiconductor nanosheet segments 132. The portions of the sacrificial sheet segments 122 can be removed using a selective isotropic etch (e.g., wet chemical etch) while leaving the exposed portions of the semiconductor nanosheet segments 132 unaffected.

In one or more embodiments, inner spacers 180 can be formed in each of the cavities adjoining the remaining portions of the sacrificial sheet segments 122, where the inner spacers 180 can be formed by a conformal deposition (e.g., ALD, PEALD, CVD, PECVD) and an etch-back using a selective directional etch (e.g., RIE).

In various embodiments, the inner spacers 180 can be a dielectric material, including, but not limited to, silicon oxide (SiO), silicon nitride (SiN), silicon oxynitride (SiON), silicon carbo nitride (SiCN) silicon oxycarbide (SiOC), silicon boronitride (SiBN), silicon boro carbonitride (SiBCN), and combinations thereof. The inner spacers 180 can be a different dielectric material from the protective liner segment 142 to provide etch selectivity. In various embodiments, the inner spacers 180 can be the same dielectric material as the sidewall spacers 170.

Figure 6:
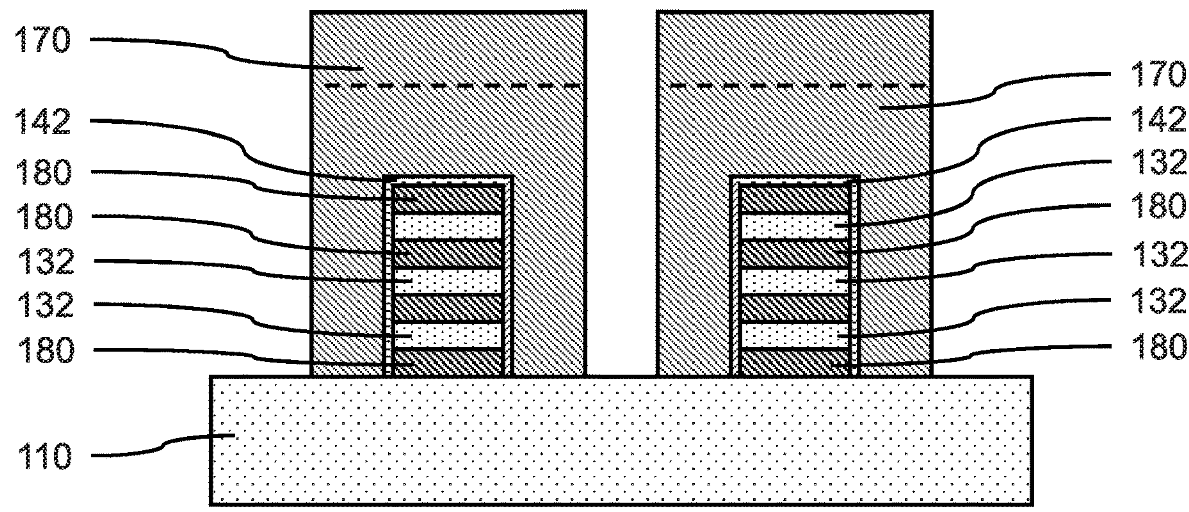
FIG. 6 is a cross-sectional side view perpendicular to FIG. 5 showing the inner spacers across the width of the sacrificial sheet segments, in accordance with an embodiment of the present invention.

FIG. 6 is a cross-sectional side view perpendicular to FIG. 5 showing the inner spacers across the width of the sacrificial sheet segments, in accordance with an embodiment of the present invention.

In various embodiments, the inner spacers 180 can extend along the full width of the sacrificial sheet segments 122, so end wall surfaces of the sacrificial sheet segments 122 are not exposed, whereas the end wall surfaces of the semiconductor nanosheet segments 132 are exposed.

Figure 7:
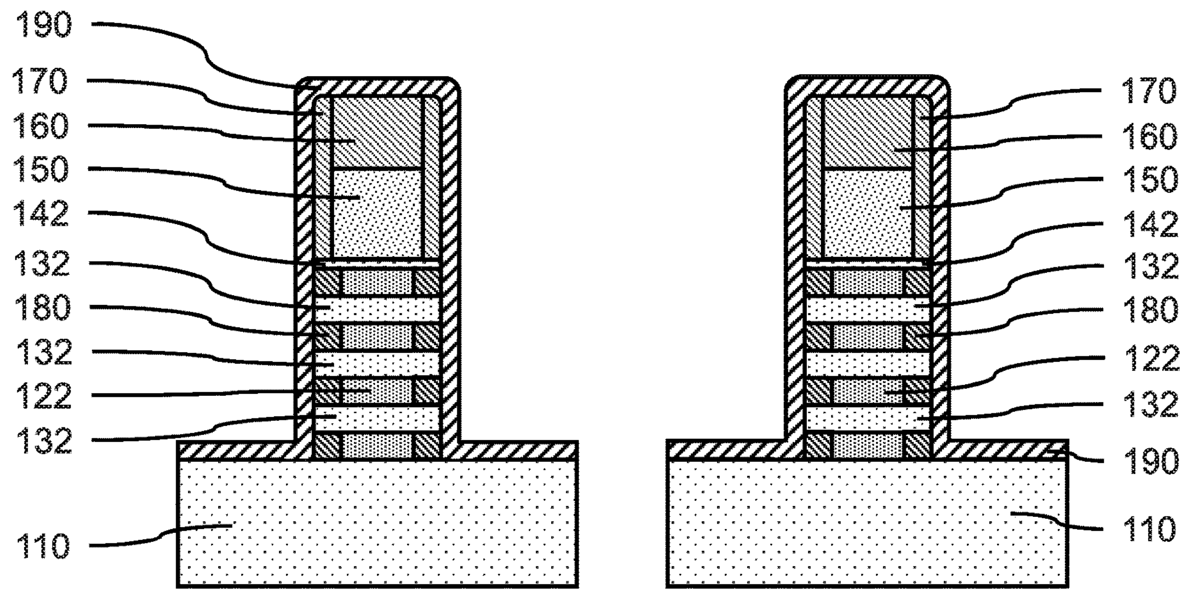
FIG. 7 is a cross-sectional side view showing a protective cap layer formed on the sidewall spacers, dummy gate structures, and trimmed stacks with the inner spacers, in accordance with an embodiment of the present invention.

FIG. 7 is a cross-sectional side view showing a protective cap layer formed on the sidewall spacers, dummy gate structures, and trimmed stacks with the inner spacers, in accordance with an embodiment of the present invention.

In one or more embodiments, a protective cap layer 190 can be formed on the substrate 110, sidewall spacers 170, dummy gate structures 165, and trimmed stacks 116, where the protective cap layer 190 can cover the end wall surfaces of the semiconductor nanosheet segments 132 and inner spacers 180. The protective cap layer 190 can be formed by a conformal deposition (e.g., ALD, PEALD, CVD, PECVD).

In various embodiments, the protective cap layer 190 can be a dielectric material, including, but not limited to, silicon oxide (SiO), silicon nitride (SiN), silicon oxynitride (SiON), silicon carbo nitride (SiCN) silicon oxycarbide (SiOC), silicon boronitride (SiBN), silicon boro carbonitride (SiBCN), and combinations thereof. The protective cap layer 190 can be a different material from the inner spacers 180 and sidewall spacers 170 to provide etch selectivity.

Figure 8:
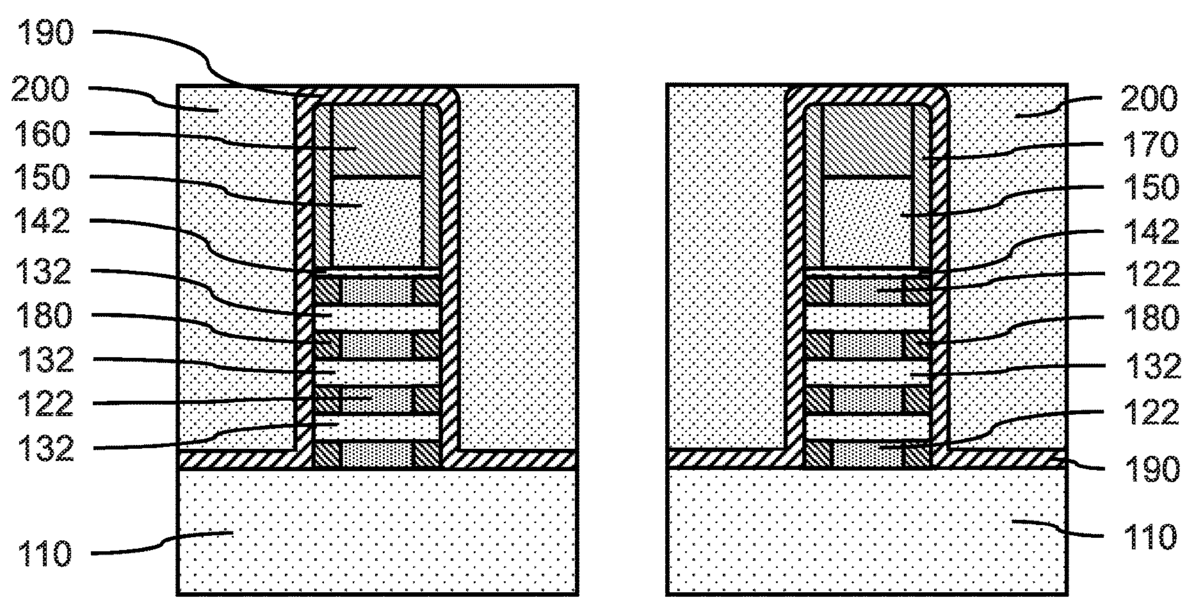
FIG. 8 is a cross-sectional side view showing a sacrificial fill layer formed on the protective cap layer, in accordance with an embodiment of the present invention.

FIG. 8 is a cross-sectional side view showing a sacrificial fill layer formed on the protective cap layer, in accordance with an embodiment of the present invention.

In one or more embodiments, a sacrificial fill layer 200 can be formed on the protective cap layer 190, where the sacrificial fill layer 200 can be formed by a blanket deposition, for example, physical vapor deposition (PVD), CVD, or spin-on coating.

In various embodiments, the sacrificial fill layer 200 can be an easily etchable material, including, but not limited to, amorphous silicon (a-Si), amorphous carbons (a-C), silicon-germanium (SiGe), or combinations thereof.

In various embodiments, a chemical-mechanical polishing (CMP) and/or isotropic etch can be used to remove a portion of the sacrificial fill layer 200 to expose the top surface of the protective cap layer 190 on the sidewall spacers 170 and dummy gate cap 160.

Figure 9:
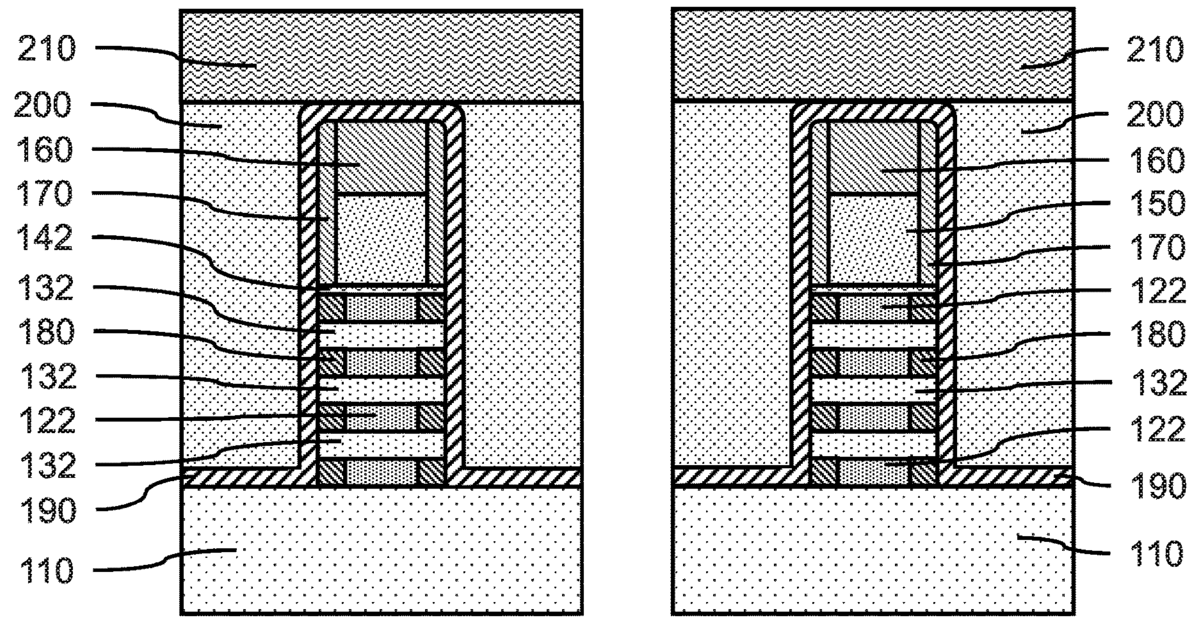
FIG. 9 is a cross-sectional side view showing a masking layer formed on the sacrificial fill layer and the protective cap layer, in accordance with an embodiment of the present invention.

FIG. 9 is a cross-sectional side view showing a masking layer formed on the sacrificial fill layer and the protective cap layer, in accordance with an embodiment of the present invention.

In one or more embodiments, a masking layer 210 can be formed on the sacrificial fill layer 200 and exposed surface of the protective cap layer 190. The masking layer 210 can be formed by a blanket deposition, where the masking layer 210 can be a hardmask, a soft mask, or a combination thereof. The masking layer 210 can include a photoresist layer.

Figure 10:
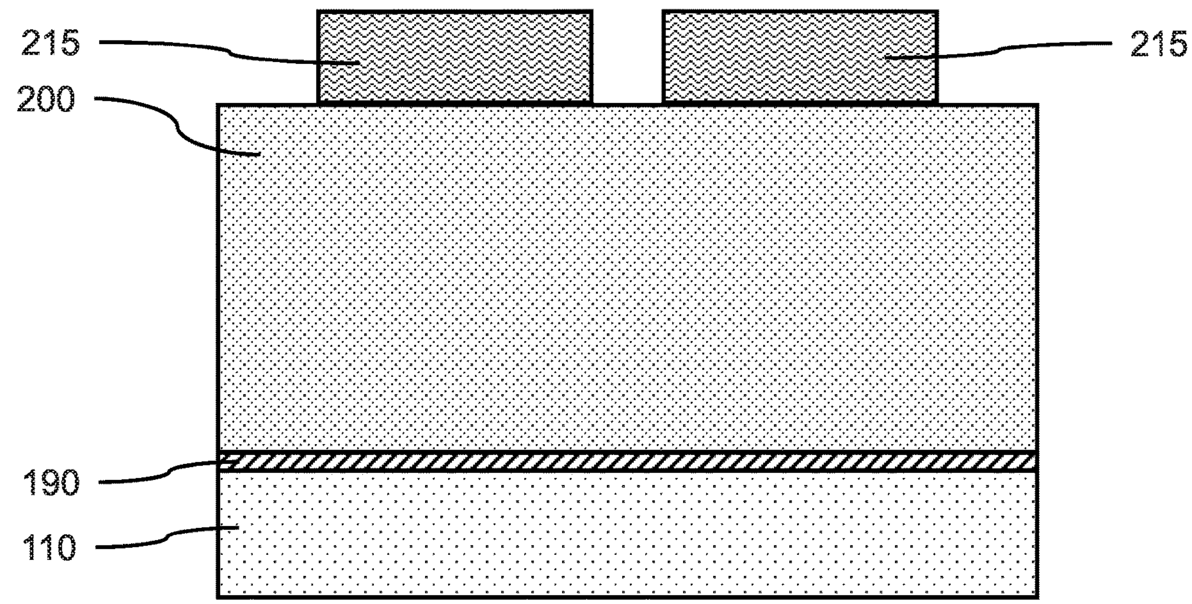
FIG. 10 is a cross-sectional side view perpendicular to FIG. 9 showing a patterned masking layer on the sacrificial fill layer, in accordance with an embodiment of the present invention.

FIG. 10 is a cross-sectional side view perpendicular to FIG. 9 showing a patterned masking layer on the sacrificial fill layer, in accordance with an embodiment of the present invention.

In various embodiments, the masking layer 210 can be patterned using lithographic techniques and etching to form masking blocks 215 that expose portions of the sacrificial fill layer 200 and/or protective cap layer 190 between or over predetermined dummy gate structures 165 and trimmed gate stacks 116, while remaining between or over other dummy gate structures 165 and trimmed gate stacks 116. The masking blocks 215 can cover dummy gate structures 165.

A patterned masking layer can define the active area for forming source and drain regions.

Figure 11:
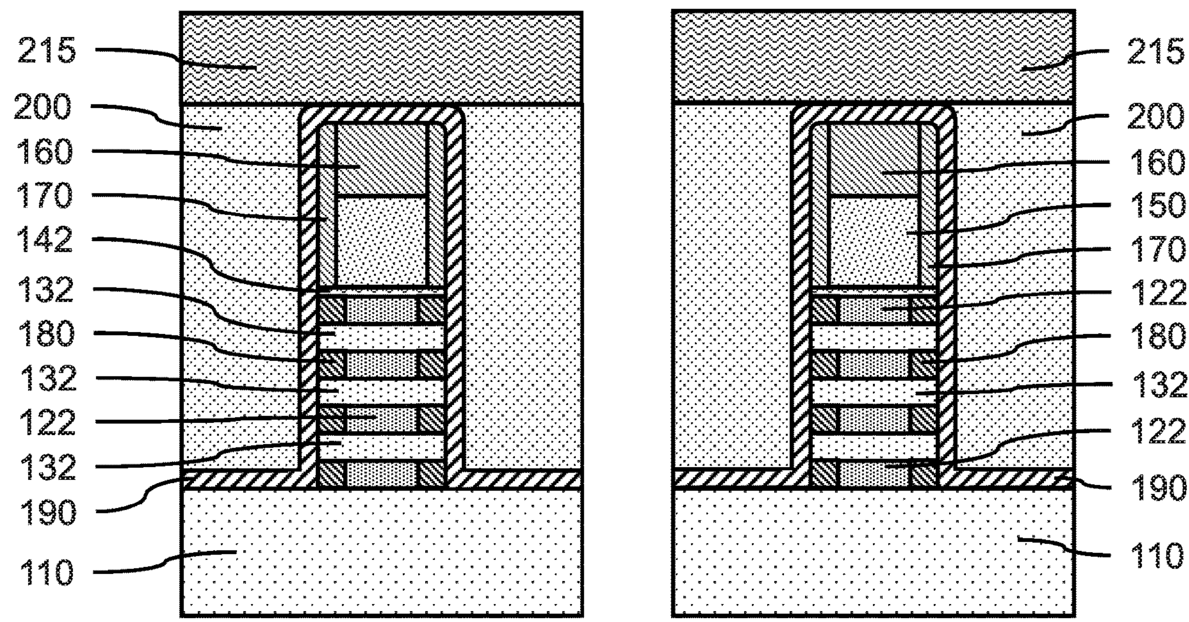
FIG. 11 is a cross-sectional side view showing the patterned masking layer on each of the sacrificial fill layers and gate structures, in accordance with an embodiment of the present invention.

FIG. 11 is a cross-sectional side view showing the patterned masking layer on each of the sacrificial fill layers and gate structures, in accordance with an embodiment of the present invention.

In one or more embodiments, the masking blocks 215 from the patterned masking layer can be over dummy gate structures 165 and trimmed gate stacks 116 for both NFET nanosheet devices and PFET nanosheet devices.

Figure 12:
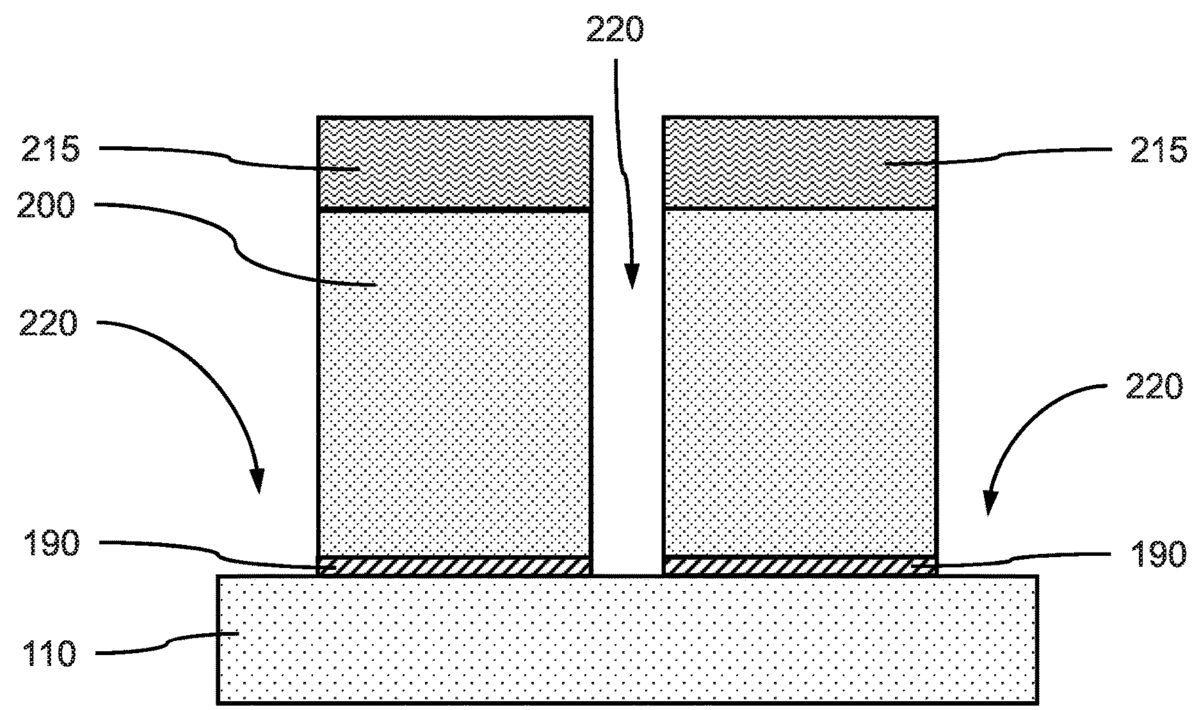
FIG. 12 is a cross-sectional side view perpendicular to FIG. 11 showing a portion of the sacrificial fill layer adjacent to the dummy gate structures and stacks removed to form recesses that expose a portion of the substrate, in accordance with an embodiment of the present invention.

FIG. 12 is a cross-sectional side view perpendicular to FIG. 11 showing a portion of the sacrificial fill layer adjacent to the dummy gate structures and stacks removed to form recesses that expose a portion of the substrate, in accordance with an embodiment of the present invention.

In one or more embodiments, a portion of the sacrificial fill layer 200 adjacent to the dummy gate structures 165 and trimmed stacks 116 can be removed to form recesses 220 that expose a portion of protective cap layer 190, which can be removed to expose the underlying substrate 110. The sacrificial fill layer 200 can be removed using a selective, directional etch (e.g., RIE), such that a portion of the sacrificial fill layer 200 remains between the recess 220 and the face of the dummy gate structures 165 and trimmed stacks 116. In various embodiments, an end wall of the dummy gate structures 165 can be exposed by the recess(es) 220.

Figure 13:
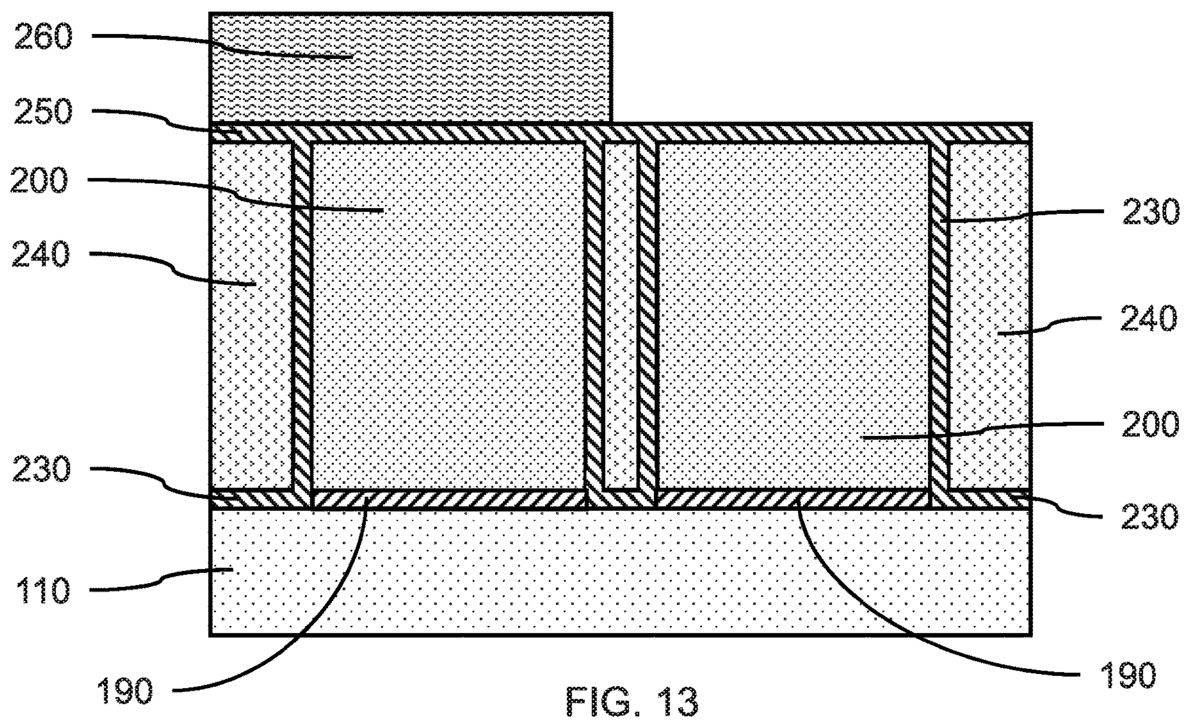
FIG. 13 is a cross-sectional side view perpendicular to FIG. 11 showing a recess liner in the recesses of the sacrificial fill layer, and a dielectric fill layer in the recesses on the recess liner, in accordance with an embodiment of the present invention.

FIG. 13 is a cross-sectional side view perpendicular to FIG. 11 showing a recess liner in the recesses of the sacrificial fill layer, and a dielectric fill layer in the recesses on the recess liner, in accordance with an embodiment of the present invention.

In one or more embodiments, masking layer 210 can be removed from the sacrificial fill layer 200, where the top surfaces of the sacrificial fill layer 200 can be exposed. In various embodiments, removal of the portion of the masking layer 210 can expose a region for an NFET.

In one or more embodiments, a recess liner 230 can be formed in the recesses 220 of the sacrificial fill layer 200 and on the exposed surfaces of the sacrificial fill layer 200, where the recess liner 230 can be formed by a conformal deposition. In various embodiments, the recess liner 230 can be a dielectric material that can be selectively removed from the other layers.

In one or more embodiments, a dielectric fill layer 240 can be formed in the recesses 220 on the recess liner 230, where the dielectric fill layer 240 can be formed by a CVD type flowable oxide or spin-on glass type dielectric deposition to fill in the recesses, so the recesses do not become pinched off. The dielectric fill layer 240 can be a dielectric material that can be selectively removed. In various embodiments, portions of the recess liner 230 and dielectric fill layer 240 that extend above the sacrificial fill layer 200 can be removed using a selective isotropic etch to leave the top surface of the protective cap layer 190 and sacrificial fill layer 200 exposed.

In one or more embodiments, a capping layer 250 can be formed on the exposed protective cap layer 190 and sacrificial fill layer 200, where the capping layer 250 can be formed by a deposition (e.g., CVD). The capping layer 250 can be a dielectric material, where the a dielectric material can be the same as the recess liner 230.

In one or more embodiments, a blocking layer can be formed on the capping layer 250 and patterned to form blocking sections 260 on the capping layer 250. The blocking layer and blocking sections 260 can be a dielectric material, including, but not limited to an organic planarization layer (OPL). A portion of the capping layer 250 exposed by patterning the blocking layer can be removed using an isotropic etch to expose a portion of the protective cap layer 190 and sacrificial fill layer 200 on a region of the substrate.

Figure 14:
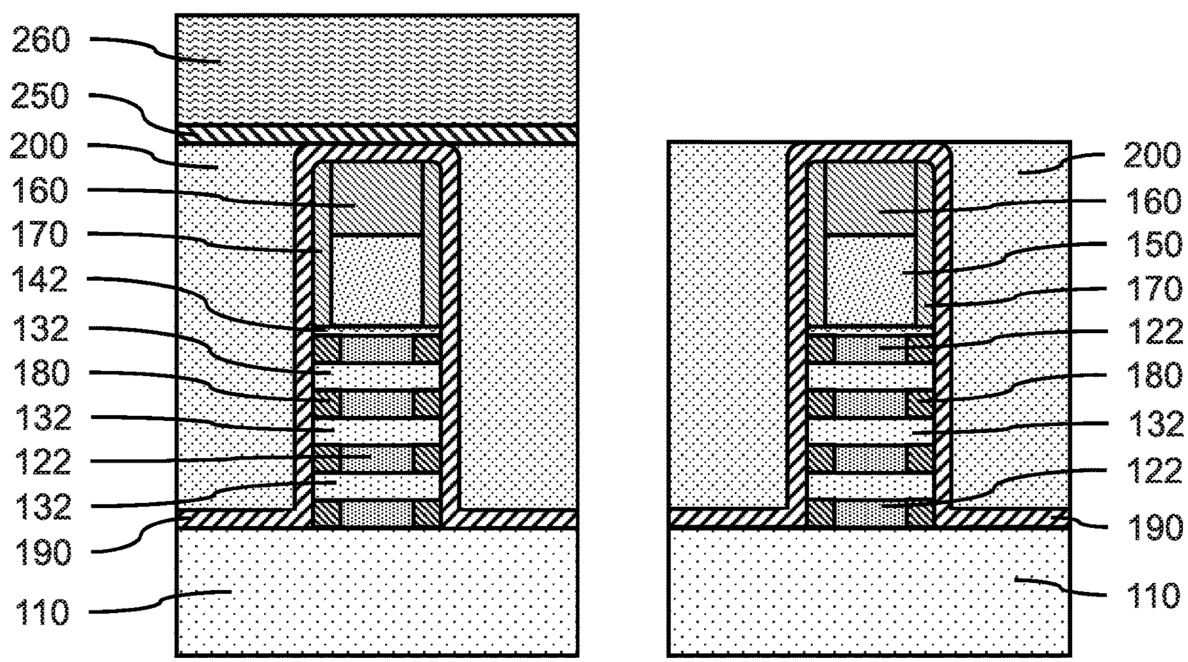
FIG. 14 is a cross-sectional side view showing a capping layer and blocking section on a portion of the sacrificial fill layer and protective cap layer on a first gate structure with the protective cap layer on the second gate structure exposed, in accordance with an embodiment of the present invention.

FIG. 14 is a cross-sectional side view showing a capping layer and blocking sections on a portion of the sacrificial fill layer and protective cap layer on a first gate structure with the protective cap layer on the second gate structure exposed, in accordance with an embodiment of the present invention.

In one or more embodiments, the capping layer 250 and blocking sections 260 can be patterned to cover one or more dummy gate structures 165, while leaving the protective cap layer 190 on one or more dummy gate structures 165 exposed. A capping layer and blocking sections can be on a portion of the sacrificial fill layer and protective cap layer on a first gate structure in PFET region with the protective cap layer on the second gate structure exposed in NFET region, in accordance with an embodiment of the present invention.

[0079] In one or more embodiments, the capping layer 250 and blocking sections 260 can be patterned to cover one or more dummy gate structures 165 of PFET regions, while leaving the protective cap layer 190 on one or more dummy gate structures 165 exposed on NFET regions.

Figure 15:
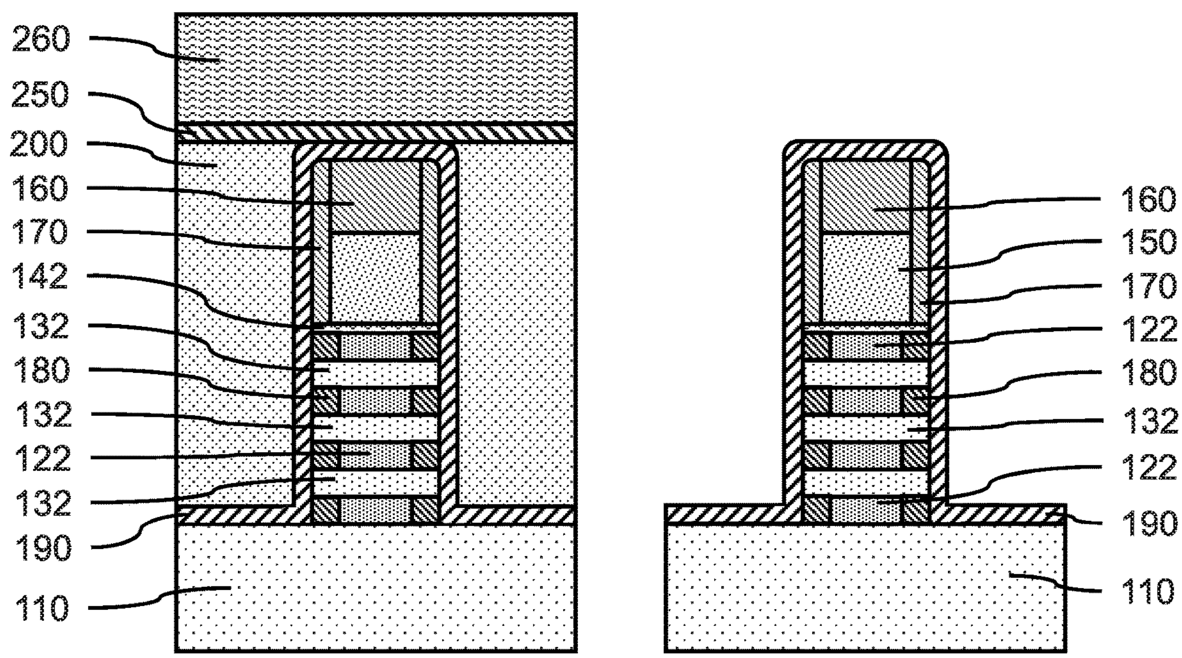
FIG. 15 is a cross-sectional side view showing the sacrificial fill layer removed from the protective cap layer on the second gate structure, in accordance with an embodiment of the present invention.

FIG. 15 is a cross-sectional side view showing the sacrificial fill layer removed from the protective cap layer on the second gate structure, in accordance with an embodiment of the present invention.

In one or more embodiments, the sacrificial fill layer 200 not covered by capping layer 250 and blocking sections 260 can be removed using a selective isotropic etch, where the removal of the sacrificial fill layer 200 exposes the underlying protective cap layer 190.

Figure 16:
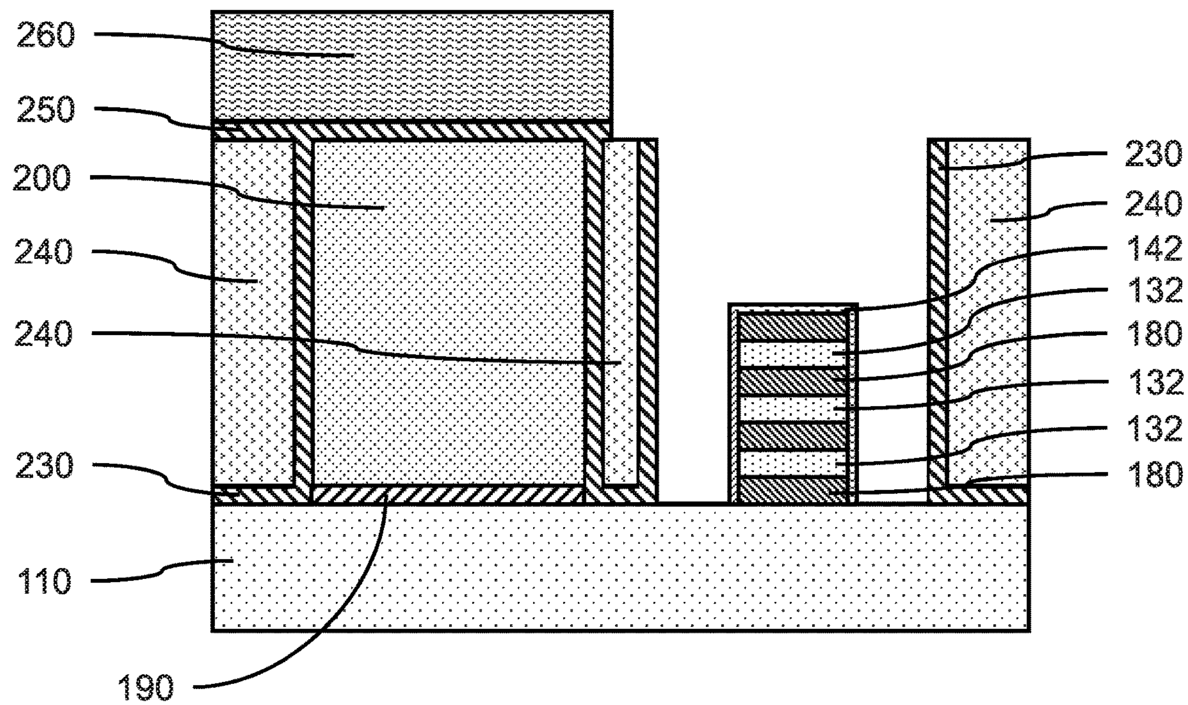
FIG. 16 is a cross-sectional side view perpendicular to FIG. 15 showing a portion of the capping layer removed, and the sacrificial fill layer removed from between the recess liner, and a dielectric fill layer in the recesses on the recess liner, in accordance with an embodiment of the present invention.

FIG. 16 is a cross-sectional side view perpendicular to FIG. 15 showing a portion of the capping layer removed, and the sacrificial fill layer removed from between the recess liner, and a dielectric fill layer in the recesses on the recess liner, in accordance with an embodiment of the present invention.

In one or more embodiments, a portion of the capping layer 250 is removed, and the sacrificial fill layer 200 between portions of the recess liner 230 is removed to expose semiconductor nanosheet segments 132 of the trimmed stack 116. The blocking section 260 can remain on the adjacent dummy gate structure 165 and trimmed stack 116.

Figure 17:
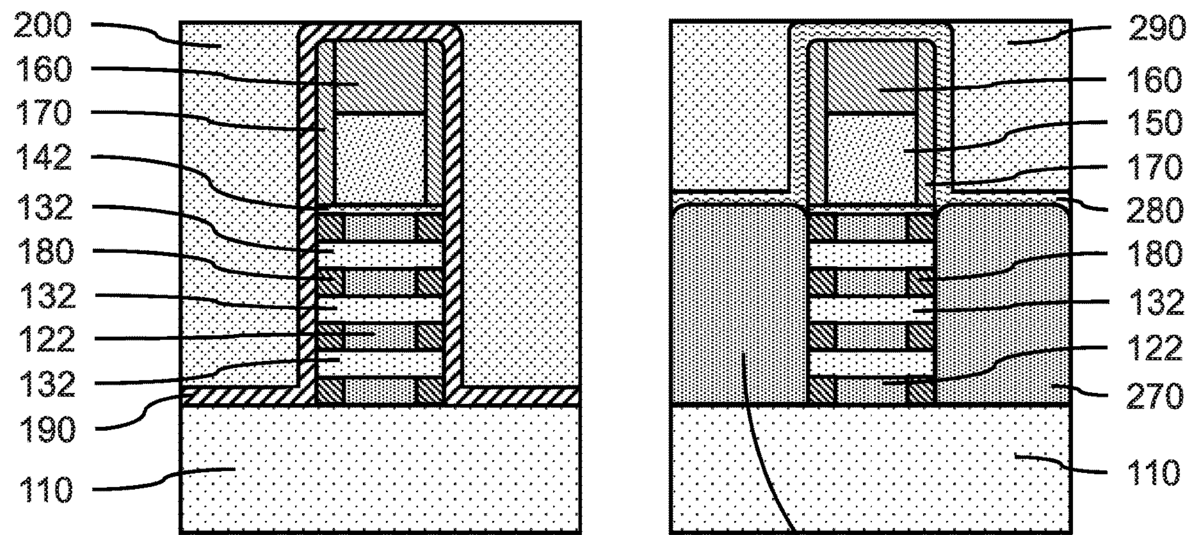
FIG. 17 is a cross-sectional side view showing the protective cap layer removed from a dummy gate structure to expose the end walls of the semiconductor nanosheet segments, and source/drains formed on opposite sides of the semiconductor nanosheet segments, and a source/drain liner and second fill layer formed on the source/drains, in accordance with an embodiment of the present invention.

FIG. 17 is a cross-sectional side view showing the protective cap layer removed from a dummy gate structure to expose the end walls of the semiconductor nanosheet segments, and source/drains formed on opposite sides of the semiconductor nanosheet segments, and a source/drain liner and second fill layer formed on the source/drains, in accordance with an embodiment of the present invention.

In one or more embodiments, the exposed protective cap layer 190 can be removed from the dummy gate structure 165 and trimmed gate stack 116 to expose the end walls of the semiconductor nanosheet segments 132.

In one or more embodiments, source/drains 270 can be formed on opposite sides of the semiconductor nanosheet segments, where the source/drains 270 can be formed by lateral epitaxial growth from the end walls of the semiconductor nano sheet segments 132. NFET epitaxial growth can include, but is not limited to, carbon doped silicon (Si:C) or silicon carbide (SiC) doped with P.

In one or more embodiments, a source/drain liner 280 can be formed on the source/drains 270 and dummy gate structure to provide protection and an etch stop. The source/drain liner 280 can be a dielectric material.

In one or more embodiments, a second fill layer 290 can be formed on the source/drain liner 280 and source/drains 270, where excess material of the second fill layer 290 can be removed by CMP to expose the source/drain liner 280 on the dummy gate cap 160. The second fill layer 290 can be an easily etchable material (e.g., a-Si or a-C).

In various embodiments, the capping layer 250 and blocking sections 260 can be removed to expose the sacrificial fill layer 200 on other dummy gate structures 165 and trimmed stacks 116.

Figure 18:
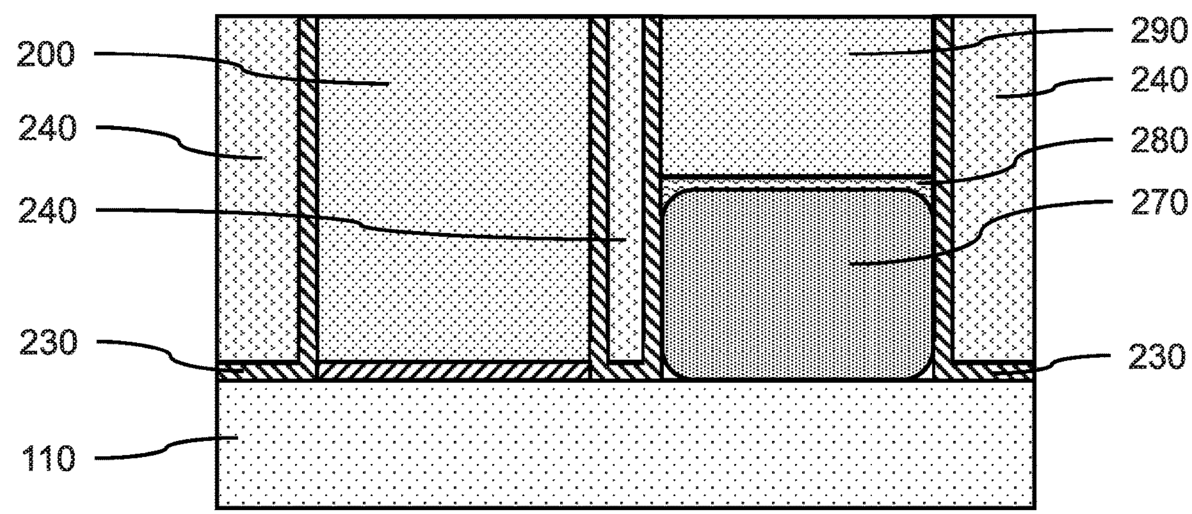
FIG. 18 is a cross-sectional side view perpendicular to FIG. 17 showing the source/drain formed on the substrate, and a source/drain liner and second fill layer formed on the source/drain, in accordance with an embodiment of the present invention.

FIG. 18 is a cross-sectional side view perpendicular to FIG. 17 showing the source/drain formed on the substrate, and a source/drain liner and second fill layer formed on the source/drain, in accordance with an embodiment of the present invention.

In one or more embodiments, a second fill layer 290 can be over the source/drains 270.

The capping layer 250 and blocking sections 260 can be removed to expose the sacrificial fill layer 200 on adjacent dummy gate structures 165 and trimmed stacks 116.

Figure 19:
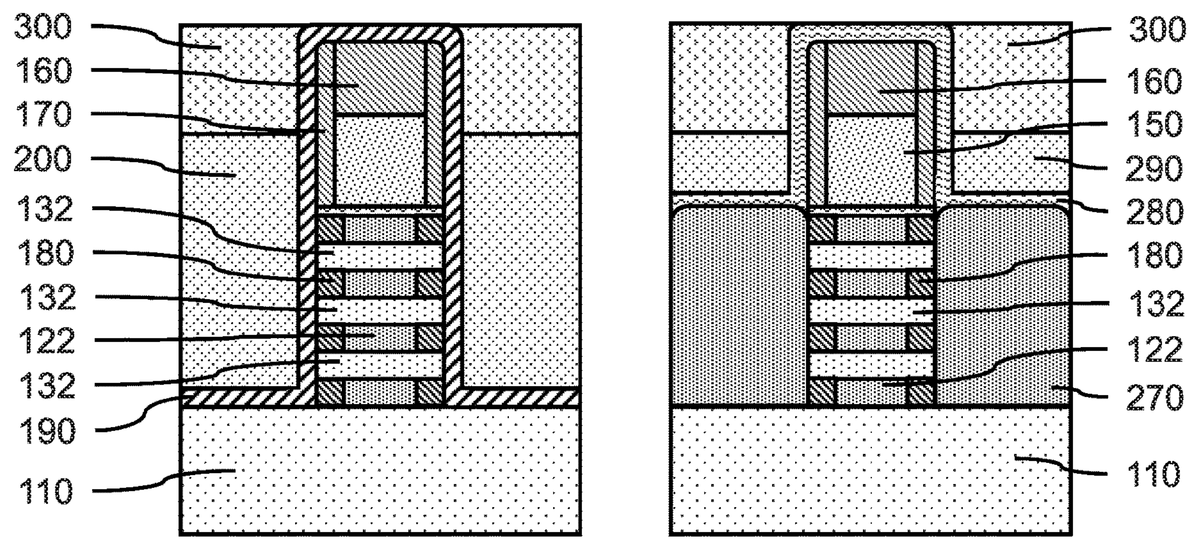
FIG. 19 is a cross-sectional side view showing the sacrificial fill layer and the second fill layer recessed, and a dielectric plug formed on the sacrificial fill layer and the second fill layer, in accordance with an embodiment of the present invention.

FIG. 19 is a cross-sectional side view showing the sacrificial fill layer and the second fill layer recessed, and a dielectric plug formed on the sacrificial fill layer and the second fill layer, in accordance with an embodiment of the present invention.

In one or more embodiments, the sacrificial fill layer 200 and the second fill layer 290 can be recessed using a directional or isotropic etch, where the depth of the recess can be below the bottom surface of the dummy gate cap 160. In various embodiments, a dielectric plug 300 can be formed on the sacrificial fill layer 200 and the second fill layer 290, where the dielectric plug 300 can be a dielectric material.

Figure 20:
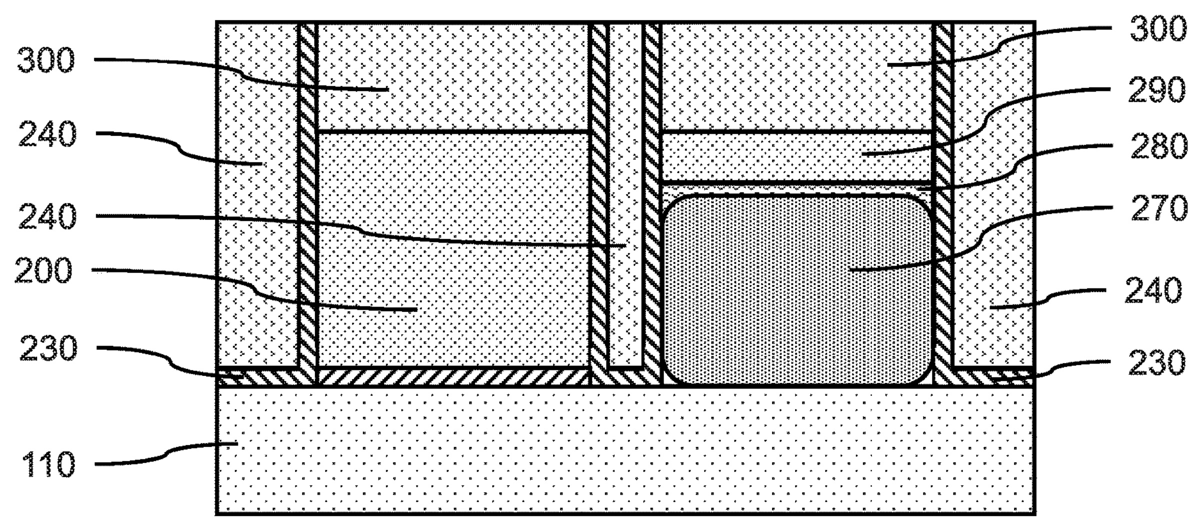
FIG. 20 is a cross-sectional side view perpendicular to FIG. 19 showing the sacrificial fill layer and the second fill layer recessed, and a dielectric plug formed on the first fill layer and the second fill layer, in accordance with an embodiment of the present invention.

FIG. 20 is a cross-sectional side view perpendicular to FIG. 19 showing the sacrificial fill layer and the second fill layer recessed, and a dielectric plug formed on the first fill layer and the second fill layer, in accordance with an embodiment of the present invention.

In one or more embodiments, the sacrificial fill layer 200 and the second fill layer 290 can be recessed, and a dielectric plug 300 formed on the sacrificial fill layer and the second fill layer.

Figure 21:
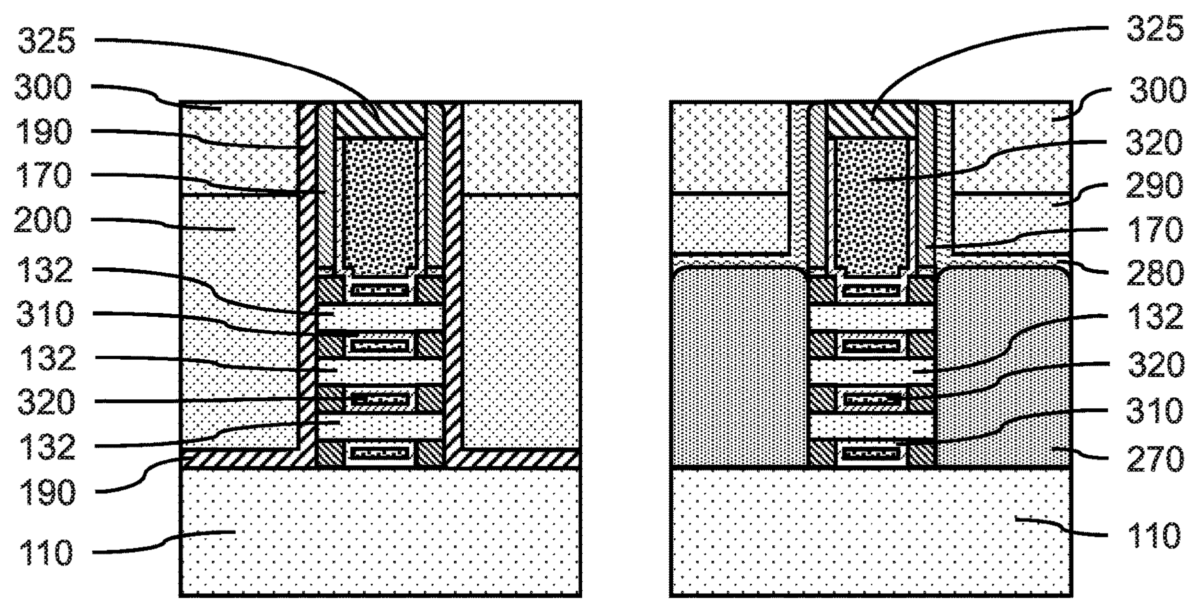
FIG. 21 is a cross-sectional side view showing the dummy gate structures removed and replaced with an active gate structures, in accordance with an embodiment of the present invention.

FIG. 21 is a cross-sectional side view showing the dummy gate structures removed and replaced with an active gate structures, in accordance with an embodiment of the present invention.

In one or more embodiments, the top portion of the protective cap layer 190 can be removed to expose the underlying dummy gate cap 160. The top portion of the source/drain liner 280 can also be removed to expose the underlying dummy gate cap 160. In various embodiments, the dummy gate caps 160 can be removed using a selective etch to expose the underlying dummy gate layer 150. The dummy gate layers 150 can be removed from two or more dummy gate structures at the same time using a selective etch. Removal of the dummy gate layers 150 can expose the sidewalls of the sacrificial sheet segments 122.

In one or more embodiments, the sacrificial sheet segments 122 can be removed using a selective isotropic etch to form channels around and expose the semiconductor nanosheet segments 132. The inner spacers 180 can be on opposite ends of the channels.

In one or more embodiments, a gate dielectric layer 310 can be formed on the exposed semiconductor nanosheet segments 132 by a conformal deposition, where the gate dielectric layer 310 can be formed by a conformal deposition on the semiconductor nanosheet segments 132 and inner spacers 180. A conductive gate fill layer 320 can be formed on the gate dielectric layer 310, where the conductive gate fill layer 320 can fill in the remaining portions of the cavities to form a gate-all-around structure on the semiconductor nanosheet segments 132.

In one or more embodiments, the gate dielectric layer 310 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, the gate dielectric layer 310 can have a thickness in a range of about 1 nm to about 5 nm, or about 2 nm to about 3 nm, although other thicknesses are contemplated. The gate dielectric layer 310 on facing surfaces of adjacent semiconductor nanosheet segments 132 can fill in a portion of the cavities, while leaving sufficient space between the adjacent layers to form the conductive gate fill layer 320. A gate cap 325 can be formed on the conductive gate fill layer 320 and gate dielectric layer 310, where the gate cap can be a dielectric material.

In one or more embodiments, the conductive gate fill layer 320 can be a conductive metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

Figure 22:
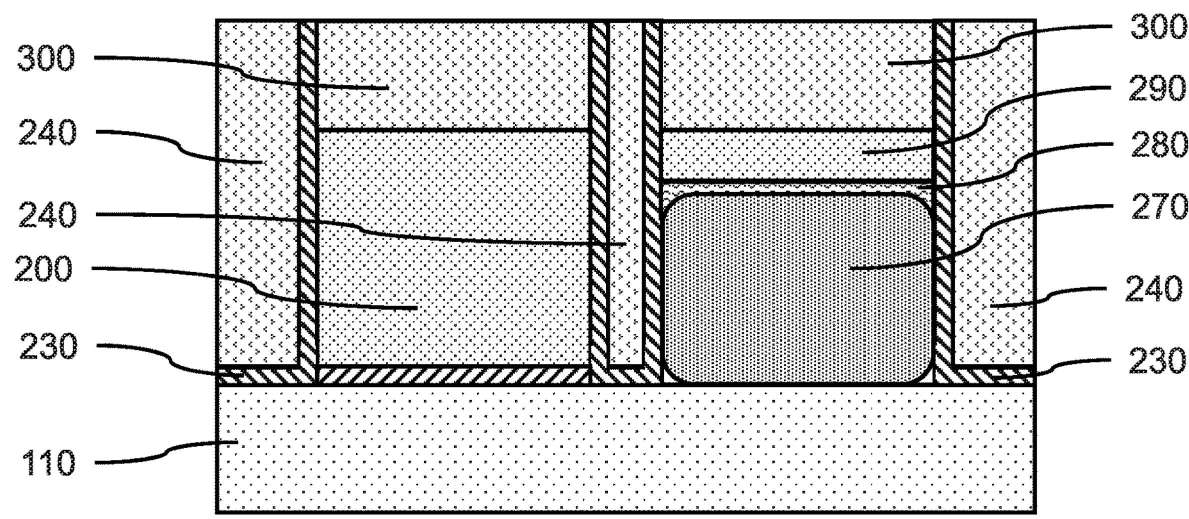
FIG. 22 is a cross-sectional side view perpendicular to FIG. 21 showing the sacrificial fill layer, the second fill layer, and the dielectric plugs, in accordance with an embodiment of the present invention.

FIG. 22 is a cross-sectional side view perpendicular to FIG. 21 showing the sacrificial fill layer, the second fill layer, and the dielectric plugs, in accordance with an embodiment of the present invention.

In one or more embodiments, the source/drains 270 can be formed on the semiconductor nanosheet segments 132 for an NFET before removing the dummy gate structures and forming the replacement metal gate (RMG) structures on the semiconductor nanosheet segments 132. The sacrificial fill layer 200 can remain for the PFET adjacent to the NFET after formation of the RMG structure. The recess liner 230 and dielectric fill layer 240 can physically separate the NFET from the adjacent PFET.

Figure 23:
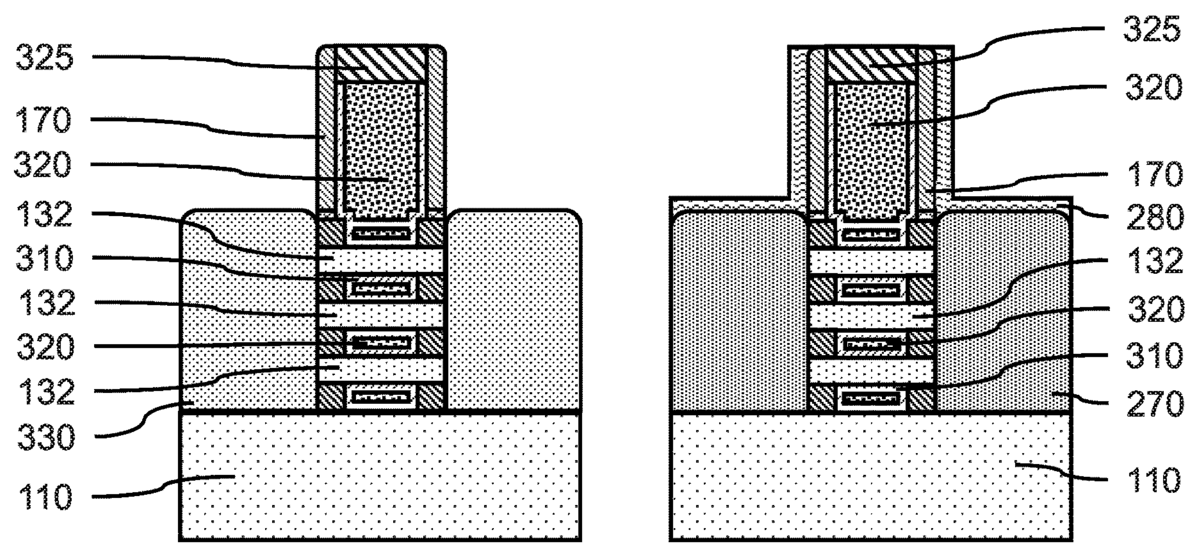
FIG. 23 is a cross-sectional side view showing source/drains formed on the first stack, with the dummy gate structure removed from the first dummy gate structure and replaced with an active gate structure, in accordance with an embodiment of the present invention.

FIG. 23 is a cross-sectional side view showing source/drains formed on the first stack, with the dummy gate structure removed from the first dummy gate structure and replaced with an active gate structure, in accordance with an embodiment of the present invention.

In one or more embodiments, the semiconductor nanosheet segments 132 with the gate-all-around structure and source/drains 270 can be masked off using lithographic techniques and etching to expose other semiconductor nanosheet segments 132 without source/drains 270.

In one or more embodiments, the dielectric plug(s) 300 can be removed to expose the underlying sacrificial fill layer 200 and second fill layer 290. The exposed sacrificial fill layer 200 and can be removed to expose the end walls of the semiconductor nanosheet segments 132 using an isotropic etch. Removal of the second fill layer 290 can expose the source/drain liner 280 that remains to protect source/drains 270.

In one or more embodiments, source/drains 330 can be formed on opposite sides of the semiconductor nanosheet segments 132, where the source/drains 330 can be formed by lateral epitaxial growth from the end walls of the semiconductor nanosheet segments 132. In various embodiments, a PFET epitaxial growth of source/drains 330 can include but is not limited to silicon-germanium (SiGe) doped with boron (B) or gallium (Ga).

In one or more embodiments, the second fill layer 290 and the source/drain liner 280 can be removed from the source/drains 270.

Figure 24:
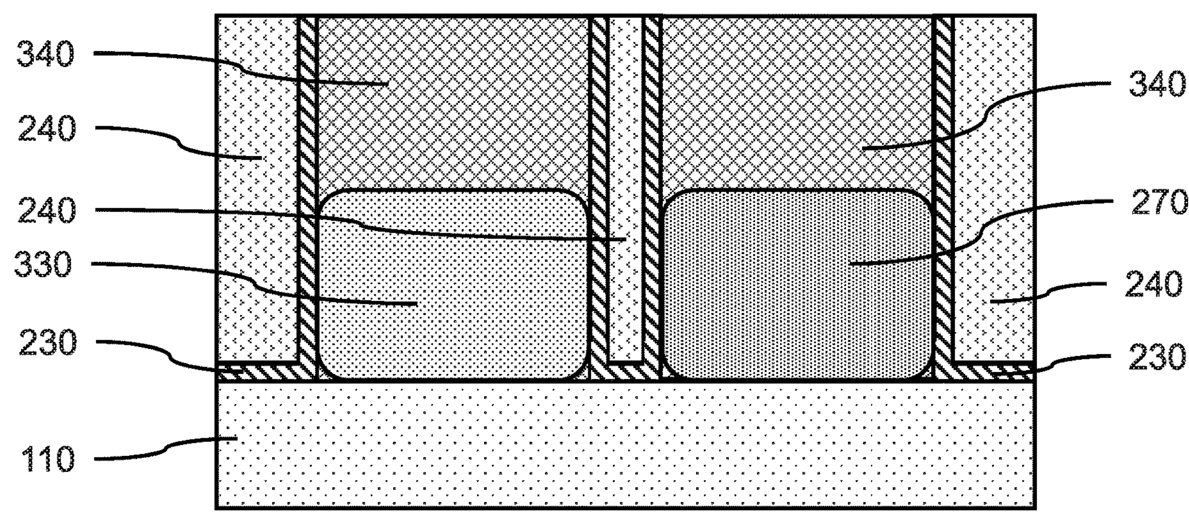
FIG. 24 is a cross-sectional side view perpendicular to FIG. 123 showing the source/drain formed on the first stack, in accordance with an embodiment of the present invention.

FIG. 24 is a cross-sectional side view perpendicular to FIG. 23 showing the source/drain formed on the first stack, in accordance with an embodiment of the present invention.

In one or more embodiments, source/drain contacts 340 can be formed to the source/drains 270 and to the source/drains 330, where the source/drain contacts 340 can be a conductive metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming complementary metal-oxide-semiconductor (CMOS) nanosheet devices, comprising:

forming at least two adjacent trimmed stacks of sacrificial sheet segments and semiconductor nanosheet segments on a substrate, with a dummy gate structure and sidewall spacers on each of the at least two adjacent trimmed stacks;

replacing a portion of each of the sacrificial sheet segments with an inner spacer;

forming a protective cap layer over the at least two adjacent trimmed stacks with the dummy gate structure and the sidewall spacers;

forming a sacrificial fill layer on the protective cap layer;

forming a recess through the sacrificial fill layer and protective cap layer between the at least two adjacent trimmed stacks with the dummy gate structure and the sidewall spacers;

depositing a recess liner in the recess;

forming a dielectric fill layer in the recess on the recess liner;

forming a capping layer on one of the at least two adjacent trimmed stacks;

removing the sacrificial fill layer from at least another one of the at least two adjacent trimmed stacks; and forming a source/drain on the semiconductor nanosheet segments of the other one of the at least two adjacent trimmed stacks.

2. The method of claim 1, further comprising forming a source/drain liner on the source/drain, and forming a second fill layer on the source/drain liner.

3. The method of claim 2, further comprising removing the dummy gate structure from each of the at least two adjacent trimmed stacks.

4. The method of claim 3, further comprising removing the sacrificial sheet segments from each of the at least two adjacent trimmed stacks.

5. The method of claim 4, further comprising forming a gate dielectric layer on the semiconductor nanosheet segments.

6. The method of claim 5, further comprising forming a conductive gate fill layer on the gate dielectric layer.

7. The method of claim 6, further comprising removing the sacrificial fill layer from the one of the at least two adjacent trimmed stacks.

8. The method of claim 7, further comprising forming a source/drain on the semiconductor nanosheet segments of the one of the at least two adjacent trimmed stacks.

9. The method of claim 8, further comprising removing the source/drain liner from the other one of the at least two adjacent trimmed stacks.

10. The method of claim 9, further comprising forming a source/drain contact to each of the source/drains.

11. A method of forming complementary metal-oxide-semiconductor (CMOS) nanosheet devices, comprising:

forming at least two adjacent trimmed stacks of sacrificial sheet segments and semiconductor nanosheet segments on a substrate, with a dummy gate structure and sidewall spacers on each of the at least two adjacent trimmed stacks;

replacing a portion of each of the sacrificial sheet segments with an inner spacer;

forming a protective cap layer over the at least two adjacent trimmed stacks with the dummy gate structure and the sidewall spacers;

forming a sacrificial fill layer on the protective cap layer;

forming a masking layer on the sacrificial fill layer;

patterning the masking layer to form masking blocks over the at least two adjacent trimmed stacks;

forming a recess through the sacrificial fill layer and protective cap layer between the at least two adjacent trimmed stacks with the dummy gate structure and the sidewall spacers;

removing the masking blocks;

depositing a recess liner in the recess;

forming a dielectric fill layer in the recess on the recess liner;

forming a capping layer on one of the at least two adjacent trimmed stacks;

removing the sacrificial fill layer from at least another one of the at least two adjacent trimmed stacks; and forming a source/drain on the semiconductor nanosheet segments of the other one of the at least two adjacent trimmed stacks.

12. The method of claim 11, further comprising forming a source/drain liner on the source/drain, and forming a second fill layer on the source/drain liner.

13. The method of claim 12, further comprising removing the dummy gate structure from each of the at least two adjacent trimmed stacks.

14. The method of claim 13, further comprising removing the sacrificial sheet segments from each of the at least two adjacent trimmed stacks.

15. The method of claim 14, further comprising forming a gate dielectric layer on the semiconductor nanosheet segments.

* * * * *